United States Patent
Kim

(10) Patent No.: US 12,293,927 B2
(45) Date of Patent: May 6, 2025

(54) METHOD OF AUTOMATICALLY SETTING PURGE MODE OF STB AND SYSTEM FOR MANUFACTURING SEMICONDUCTOR WAFER

(71) Applicant: SEMES CO., LTD., Chungcheongnam-do (KR)

(72) Inventor: Young Woo Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 155 days.

(21) Appl. No.: 18/105,662

(22) Filed: Feb. 3, 2023

(65) Prior Publication Data

US 2023/0402296 A1    Dec. 14, 2023

(30) Foreign Application Priority Data

Jun. 14, 2022  (KR) .................. 10-2022-0072083

(51) Int. Cl.
*H01L 21/67*    (2006.01)
*H01L 21/677*   (2006.01)

(52) U.S. Cl.
CPC .. *H01L 21/67017* (2013.01); *H01L 21/67253* (2013.01); *H01L 21/67265* (2013.01); *H01L 21/67733* (2013.01)

(58) Field of Classification Search
CPC ......... H01L 21/67017; H01L 21/67253; H01L 21/67265; H01L 21/67733
See application file for complete search history.

(56) References Cited

U.S. PATENT DOCUMENTS

| 2015/0303086 A1 | 10/2015 | Yoo et al. |
| 2018/0247846 A1 | 8/2018 | Murata et al. |
| 2019/0057889 A1* | 2/2019 | Mao ................ C23C 14/543 |
| 2021/0257233 A1* | 8/2021 | Narasimhan ........ H01L 21/6719 |

FOREIGN PATENT DOCUMENTS

| KR | 10-1418733 | 8/2014 |
| KR | 10-2018-0033255 | 4/2018 |
| KR | 10-2020-0087290 | 7/2020 |

OTHER PUBLICATIONS

Office Action dated Jun. 20, 2024 for Korean Patent Application No. 10-2022-0072083 and its English translation from Global Dossier.

* cited by examiner

*Primary Examiner* — P. Macade Nichols
(74) *Attorney, Agent, or Firm* — WOMBLE BOND DICKINSON (US) LLP

(57) ABSTRACT

Provided are a method of automatically setting a purge mode of a side track buffer (STB) and a system for manufacturing a semiconductor wafer, and the method, performed by a system for manufacturing a semiconductor wafer including a side track buffer (STB) including a purge device for supplying inert gas to discharge a process gas of a FOUP, and a mode determination unit for determining a purge mode in which the purge device of the STB in which the FOUP is seated is able to be driven, includes identifying specifications of the purge device corresponding to a configuration of the purge device; and determining a drivable purge mode from among predetermined purge modes depending on the identified specifications of the purge device.

19 Claims, 7 Drawing Sheets

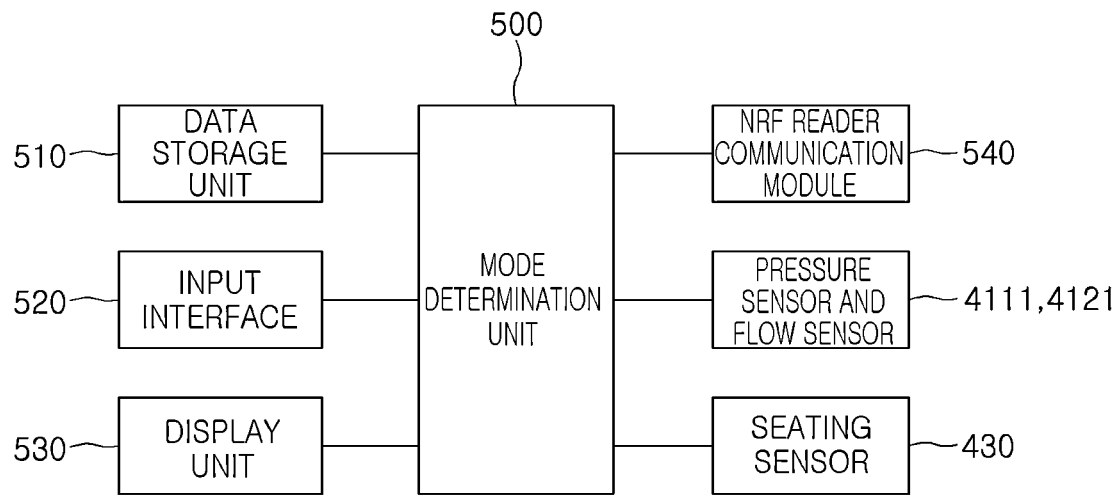
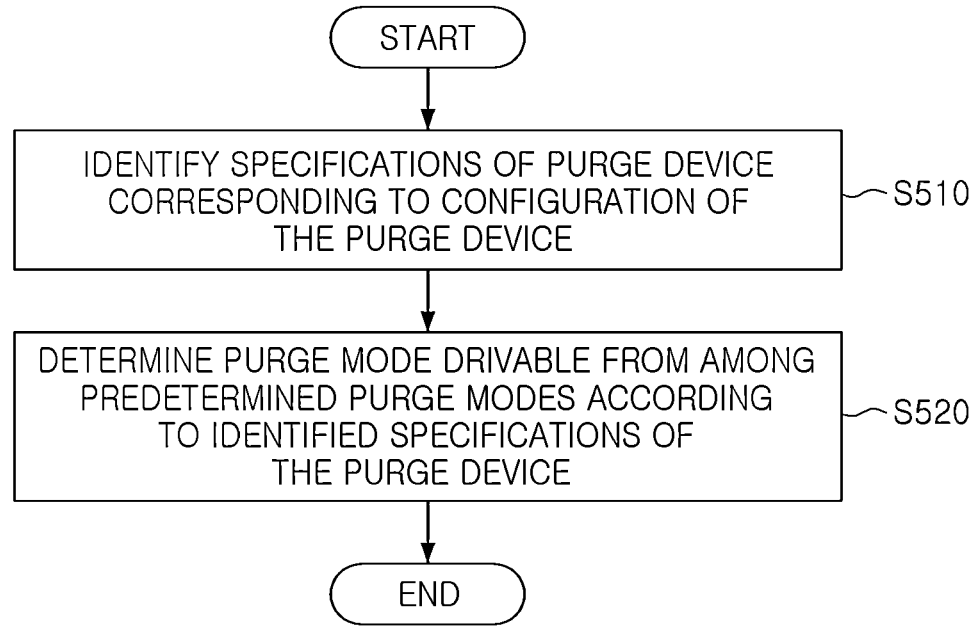

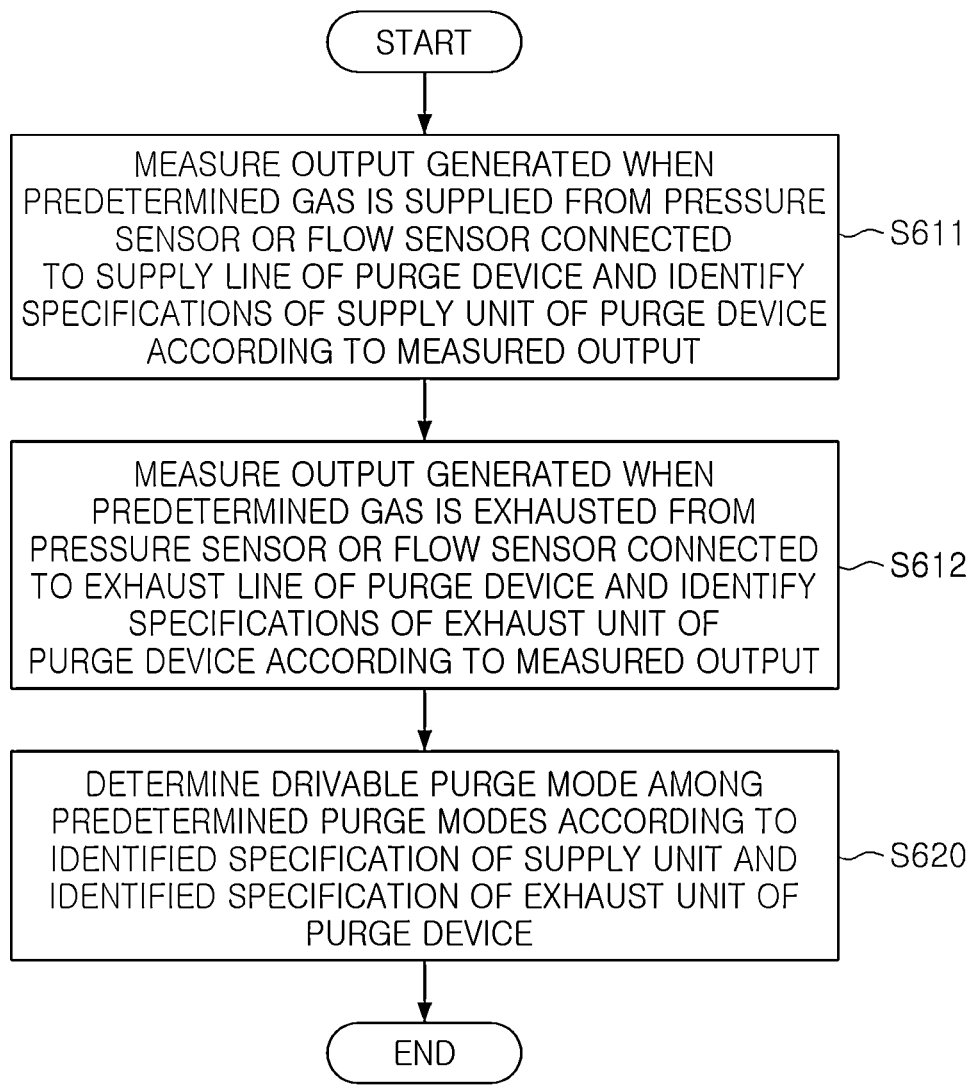

METHOD OF AUTOMATICALLY SETTING PURGE MODE OF STB AND SYSTEM FOR MANUFACTURING SEMICONDUCTOR WAFER

CROSS-REFERENCE TO RELATED APPLICATION

The application claims benefit of priority to Korean Patent Application No. 10-2022-0072083 filed on Jun. 14, 2022 in the Korean Intellectual Property Office, the disclosure of which is incorporated herein by reference in its entirety.

BACKGROUND

1. Field

Example embodiments of the present disclosure relate to a method of automatically setting a purge mode of a side track buffer (STB) and a system for manufacturing a semiconductor wafer, which may perform the method.

2. Description of Related Art

When transferring a wafer manufactured in a general semiconductor manufacturing process to a facility for a subsequent process, the wafer may be stored in a wafer carriage (front opening unified pod, FOUP; hereinafter referred to as FOUP), and during transfer, the wafer may pass through a storage space, a side track buffer (STB), and may be transferred to each process apparatus.

While being transported to each process apparatus, the wafer may be exposed to oxygen or dust, and accordingly, an environment in which the wafer may be contaminated is created, and yield of semiconductor production may decrease. To prevent this, in the prior are, a purge mode in which an inert gas is supplied may be performed when a FOUP storing wafers enters the STB, thereby preventing contaminants from being in contact with the wafer during process transfer.

However, since the purge devices of the STB do not have the same hardware specifications, the presence or type of supply line, supply valve, exhaust line, and exhaust valve may differ for each purge device, and accordingly, the purge mode which the purge device may perform may also be different depending on hardware specifications of the purge device.

In the prior art, the purge mode may be performed in a unified manner without considering the different hardware specifications of the purge devices. In this case, when the purge mode, which may not be performed with the hardware specifications of the purge device, is driven, the purge device may be damaged or may malfunction, such that a lifespan of the purge device may be shortened or there may be difficulties in maintenance.

Also, when an operator manually drives the purge mode for each different purge device, in a case in which the operator accidentally drives in an undrivable purge mode, the above-described issue may still occur, such that there may be a possibility of human error.

SUMMARY

An example embodiment of the present disclosure is to provide a method of automatically setting a purge mode of an STB and a system for manufacturing a semiconductor wafer which automatically recognize specifications of the purge mode provided in the STB and may distinguish only a drivable purge mode depending on specifications of the purge mode.

According to an example embodiment of the present disclosure, a method of automatically setting a purge mode of a side track buffer (STB), performed by a system for manufacturing a semiconductor wafer including an STB including a purge device for supplying inert gas to discharge a process gas of a FOUP, and a mode determination unit for determining a purge mode in which the purge device of the STB in which the FOUP is seated is able to be driven, includes identifying specifications of the purge device corresponding to a configuration of the purge device; and determining a drivable purge mode from among predetermined purge modes depending on the identified specifications of the purge device.

According to an example embodiment of the present disclosure, a method of automatically setting a purge mode of an STB, performed by a system for manufacturing a semiconductor wafer including a side track buffer (STB) including a purge device for supplying inert gas to discharge a process gas of a FOUP, and a mode determination unit for determining a purge mode in which the purge device of the STB in which the FOUP is seated is able to be driven, includes requesting a type of nRF reader used by the purge device to an nRF reader communication module, and identifying specifications of a supply unit of the purge device corresponding to the type of the nRF reader based on information received in response to the request; measuring an output generated when a predetermined gas is exhausted from a pressure sensor or a flow sensor connected to an exhaust line of the purge device, and determining specifications of an exhaust unit of the purge device according to the measured output; and determining a drivable purge mode among predetermined purge modes according to the identified specification of a supply unit and the identified specification of an exhaust unit of the purge device.

Also, a computer recording medium for storing a computer program for performing the above-described method on a computer may be provided.

According to an example embodiment of the present disclosure, a system for manufacturing a semiconductor wafer includes a side track buffer (STB) including a purge device including a pressure sensor for measuring pressure of inert gas supplied to or exhausted from the FOUP over time, a port in which the FOUP is mounted, and a seating sensor connected to the port to measure whether the FOUP is seated, and supplying the supplied inert gas to the FOUP; and a mode determination unit for identifying specifications of the purge device of the STB in which the FOUP is seated according to an output value obtained by the pressure sensor, and determining a purge mode in which the purge device is able to be driven.

BRIEF DESCRIPTION OF THE DRAWINGS

The above and other aspects, features, and advantages of the present disclosure will be more clearly understood from the following detailed description, taken in conjunction with the accompanying drawings, in which:

FIG. 4 is a block diagram illustrating a connection configuration of a mode determination unit according to an example embodiment of the present disclosure;

FIG. 5 is a flowchart illustrating a method for setting an automatic mode of an STB according to an example embodiment of the present disclosure;

FIG. 6 is a flowchart illustrating a method for setting an automatic mode of an STB according to another example embodiment of the present disclosure;

DETAILED DESCRIPTION

Figure 1:
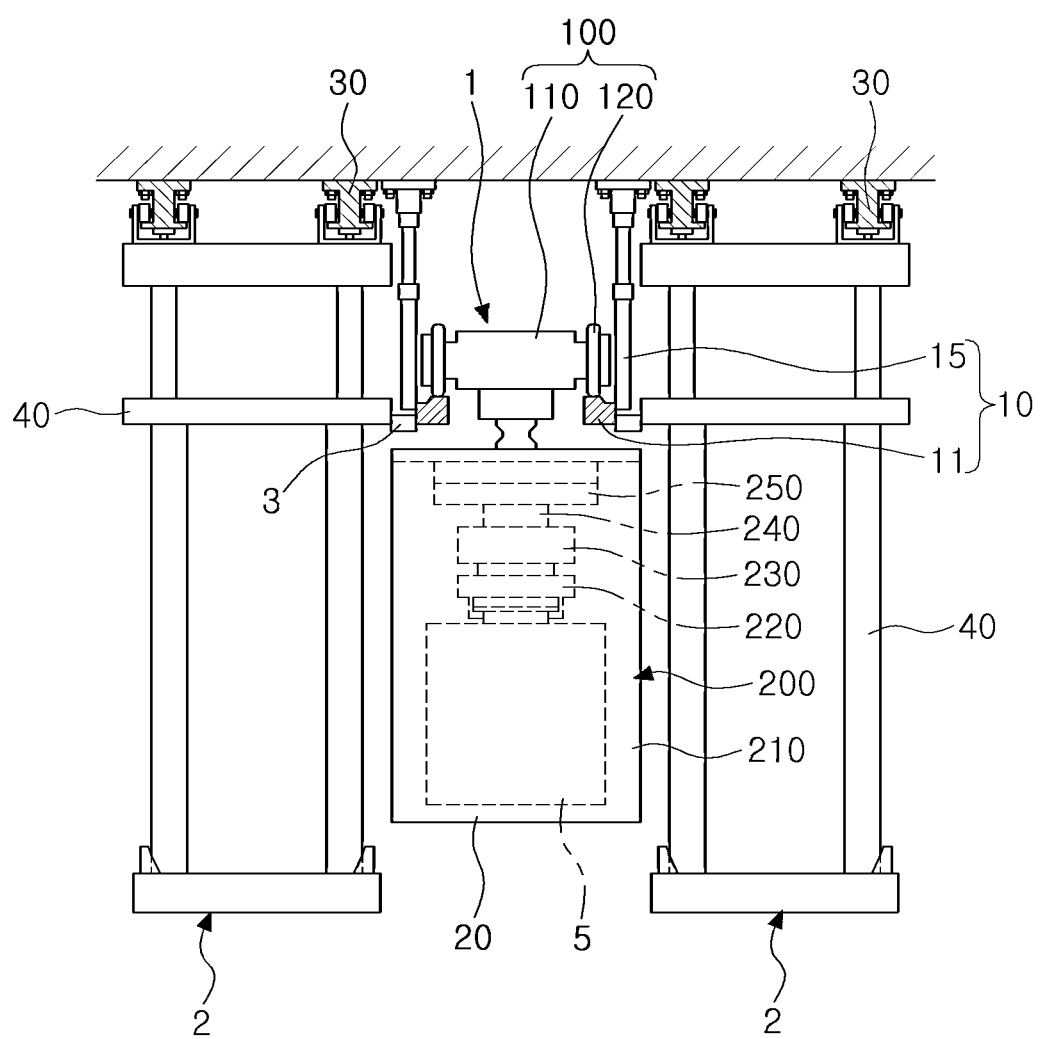
FIG. 1 is a diagram illustrating an overall configuration of a system for manufacturing a semiconductor wafer which may perform a method for automatically setting a purge mode according to an example embodiment of the present disclosure.

Hereinafter, example embodiments of the present disclosure will be described as below with reference to the attached drawings.

In the drawings, same elements will be indicated by the same reference numerals. Also, redundant descriptions and detailed descriptions of known functions and elements which may unnecessarily make the gist of the present disclosure obscure will be omitted. In the accompanying drawings, some elements may be exaggerated, omitted or briefly illustrated, and the sizes of the elements do not necessarily reflect the actual sizes of these elements. Also, the terms "upper," "upper portion," "upper surface," "lower," "lower portion," "lower surface," "side surface" are based on the drawings, and may be varied in a direction in which the components are disposed.

In the example embodiments, the term "connected" may not only refer to "directly connected" but also include "indirectly connected" by means of an adhesive layer, or the like. Also, the term. "electrically connected" may include both of the case in which elements are "physically connected" and the case in which elements are "not physically connected." The terms, "include," "comprise," "is configured to," or the like of the description are used to indicate the presence of features, numbers, processes, operations, elements, portions or combination thereof, and do not exclude the possibilities of combination or addition of one or more features, numbers, processes, operations, elements, portions or combination thereof.

Figure 2:
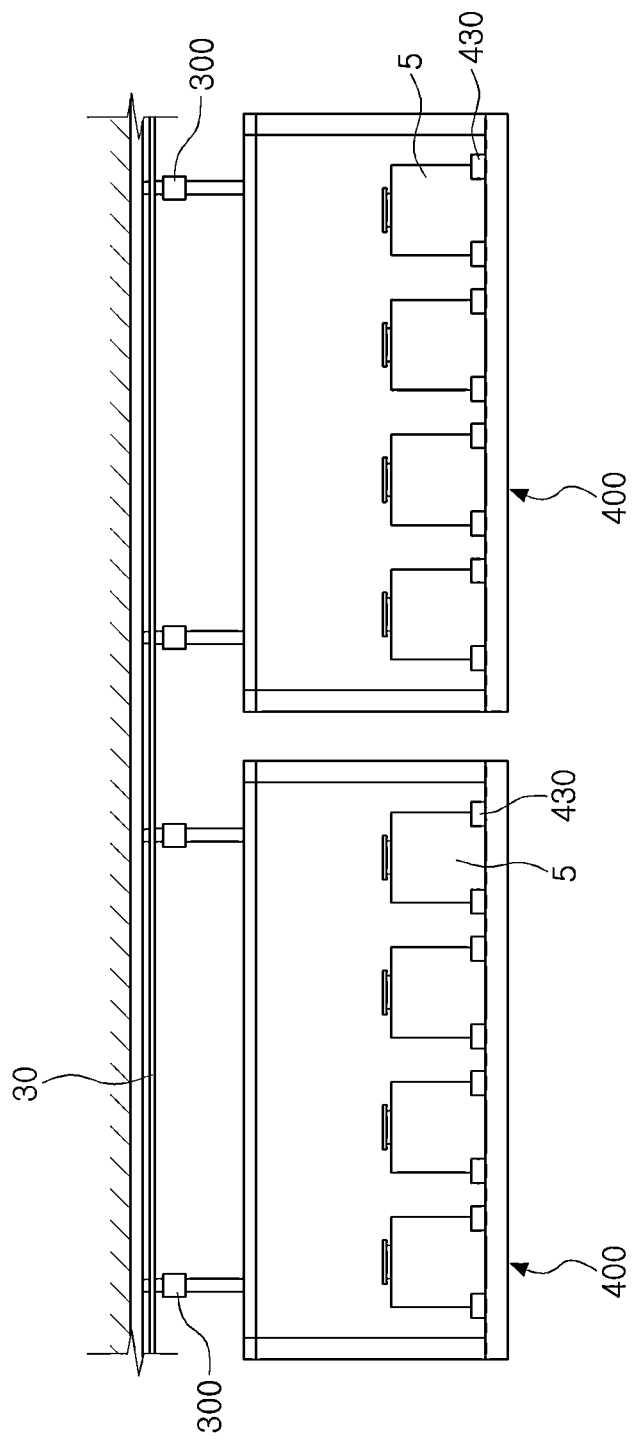
FIG. 2 is a diagram illustrating a side surface of the STB illustrated in FIG. 1.

FIGS. 1 and 2 are diagram illustrating an overall configuration of a system for manufacturing a semiconductor wafer which may perform a method for automatically setting a purge mode and the side surface of the STB 400 of the system for manufacturing a semiconductor wafer according to an example embodiment.

As illustrated in FIG. 1, an overhead hoist transport 1 (OHT) may include a traveling rail 10 and at least one or more vehicle assemblies 20. A layout of the traveling rail 10 may be determined depending on conditions at a semiconductor manufacturing site. The vehicle assembly 20 may be configured to run along the travel rail 10 and to grip and ungrip the FOUP which is an article, such that the vehicle assembly 20 may transfer the FOUP 5 from one load port to a desired load port.

Traveling rail 10 may provide at least one linear section and at least one curved section. The linear section and the curved section may be connected to each other linearly, or may diverge or join at one point. The traveling rail 10 may be installed on the ceiling. As illustrated in FIG. 1, the traveling rail 10 may include a pair of rails 11 spaced apart from each other in the horizontal direction and paired with each other, and a rail support member 15 for fixing the pair of rails 11 to the ceiling, such that the traveling rail 10 may be disposed in the upper region of the semiconductor manufacturing site. A pair of rails 11 may provide an upper traveling surface.

As an example embodiment, the vehicle assembly 20 may include a vehicle 100 traveling along the traveling rail 10, and a hoist module 200 for gripping and ungripping the FOUP 5.

The vehicle 100 may include a body 110 and wheels 120, and may further include a wheel driving unit providing power to rotate the wheels 120. The hoist module 200 may include a housing 210, a grip unit 220, a lift unit 230, a rotation driving unit 240, and a horizontal driving unit 250.

The housing 210 may provide an internal space in which the FOUP 5 is accommodated. The housing 210 may be formed to have a structure in which both sides and lower sides may be open such that the FOUP 5 may be moved in a horizontal direction and in a downward direction in an internal space.

Also, as illustrated in FIG. 1, at least one buffer device 2 may be provided. As an example embodiment, the buffer device 2 may be provided on both sides of the traveling rail respectively, or may be provided on one of sides of the traveling rail 10. The buffer device 2 may include a side rail and at least one or more buffer assemblies 40.

As illustrated in FIG. 1, the side rail 30 may be installed on the side of the traveling rail 10. The side rail 30 may be disposed adjacent to the travel rail 10. The side rail 30 may extend in the length direction of the travel rail 10 and may have a predetermined length.

The side rails 30 may include a pair of rail members spaced apart from each other in the horizontal direction and paired with each other, and fastening members for attaching a pair of rail members to the ceiling.

Also, as illustrated in FIG. 2, the buffer assembly 40 may include a moving unit 300 movable along the side rail 30, and a side track buffer (STB) 400 connected to the moving unit 300 below the side rail 30 and moving together with the moving unit 300.

In an example embodiment, at least one or more FOUPs may be seated in the STB 400. For example, as illustrated in FIG. 2, in one STB 400, a plurality of FOUPs 5 may be seated. Whether or not the FOUP 5 is seated may be measured by at least one seating sensor 430.

The entire system for manufacturing a semiconductor wafer described above is merely an example embodiment, and an example embodiment thereof is not limited thereto.

Figure 3:
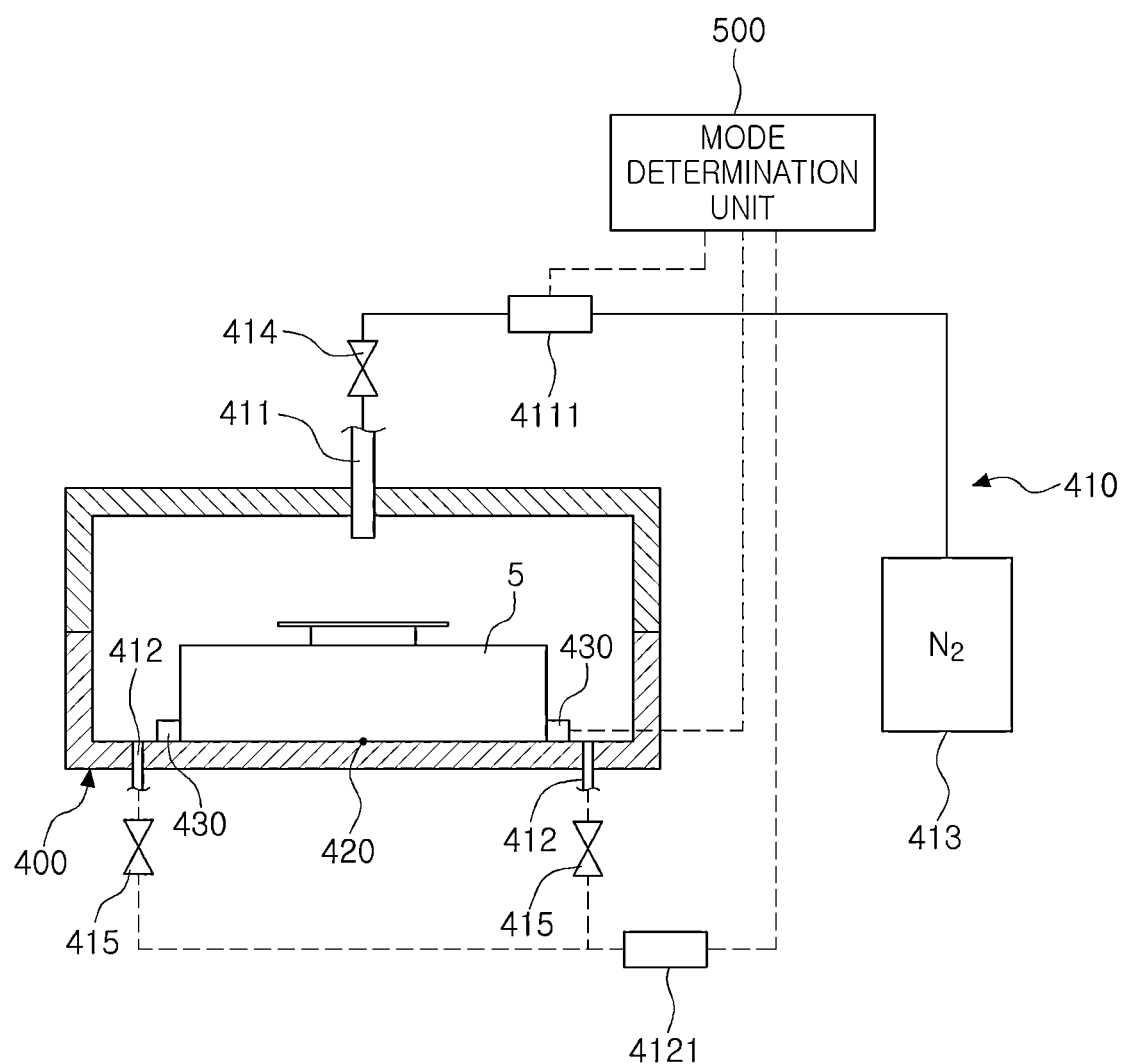
FIG. 3 is a block diagram illustrating a configuration of a system for manufacturing a semiconductor wafer which may perform a method for automatically setting a purge mode according to an example embodiment of the present disclosure.

FIGS. 3 and 4 are block diagrams illustrating the entire connection configuration of the STB 400 in which the FOUP 5 is seated and the connection configuration of the mode determination unit 500 to perform the method for automatically setting the purge mode according to an example embodiment.

As illustrated in FIG. 3, a system for manufacturing a semiconductor wafer in an example embodiment may include an STB 400 for supplying an inert gas supplied to a FOUP 5, and the STB 400 may include purge device 410 including a supply line 411 for supplying inert gas from the gas container 413 or an exhaust line 412 for exhausting inert gas and process gas after the purge mode is terminated, and a port 420 on which the FOUP 5 is mounted, and a seating sensor 430 connected to the port 420 to measure whether the FOUP 5 is seated.

Also, a mode determination unit 500 connected to the purge device 410 may be included.

For example, the purge device 410 in an example embodiment may include a supply line 411 for supplying an inert gas to the FOUP 5 and an exhaust line 412 for exhausting the supplied gas, and also, a pressure sensor and flow sensor 4111 connected to the supply line 411 and a pressure sensor and flow sensor 4121 connected to the exhaust line 412 may be disposed.

As an example embodiment, as illustrated in FIG. 3, when the purge device 410 of the STB 400 includes one supply line 411 and two exhaust lines 412, the device may include a pressure sensor and a flow sensor 4111 for measuring the pressure or flow rate of the inert gas supplied to the FOUP 5 over time, or a pressure sensor and a flow sensor 4121 for measuring the pressure of the inert gas exhausted from the FOUP 5 over time.

As an example embodiment, the pressure sensor and the flow sensor 4111 and 4121 may be connected to at least one of the supply line 411 and the exhaust line 412, and may be connected to the entirety of the supply line 411 and the exhaust line 412. Also, the pressure sensor and the flow sensor 4111 and 4121 may not be installed together, and at least one of the pressure sensor and the flow sensor may be installed to measure the pressure or flow rate.

However, an example embodiment thereof is not limited thereto, and the number of supply lines 411 and the number of exhaust lines 412 may be may be different depending on semiconductor processes.

Alternatively, as another example embodiment, a differential pressure sensor installed on the front and rear ends of the supply line 411 or a differential pressure sensor installed on the front and rear ends of the exhaust line 412 may be installed.

Although the pressure sensor and flow sensor 4111 and 4121 illustrated in FIG. 3 are illustrated in a block diagram, the sensors may be the pressure sensor and flow sensor 4111 for measuring pressure or flow rate at two different points in the supply line 411, and may be a pressure sensor and a flow sensor 4121 for measuring pressure or flow rate at two different points in the exhaust line 412.

As an example embodiment, the mode determination unit 500 may identify specifications of the purge device 410 corresponding to the measured values using measured values of the components of the purge device 410.

The purge device 410 may include a supply line 411, an exhaust line 412, a pressure sensor and a flow sensor 4111 installed in the supply line 411, and a pressure sensor and a flow sensor 4121 installed in the exhaust line 412.

That is, it may be possible to determine whether the supply line 411 of the purge device 410 is a 1 inlet, an inlet to which a solenoid valve is connected, or an inlet to which a variable valve is connected through the measured value obtained from the supply line 411. Also, it may be possible to whether the exhaust line 412 of the purge device 410 is 1 outlet or 2 outlets, and whether the outlet is an outlet connected to a solenoid valve or an outlet where natural exhaust is performed without a valve.

Accordingly, in an example embodiment, the mode determination unit 500 which may identify the specifications of the purge device 410 of the STB 400 in which the FOUP 5 is seated according to the output values obtained by the pressure and flow sensors 4111 and 4121, and determining a purge mode in which the purge device 410 may be driven.

Also, in an example embodiment, a display unit 530 (illustrated in FIG. 4) for providing the determined purge mode to the user may be further included.

The mode determination unit 500 may determine a drivable purge mode depending on the identified specifications of the purge device 400, and may display the determined drivable purge mode on the display unit 530 to convey the drivable purge mode to the user.

Specifically, the mode determination unit 500 in an example embodiment may identify the type of the supply valve or exhaust valve of the purge device 410 according to the output of the pressure sensor and flow sensor 4111 and 4121 measured in the supply line 411 or the exhaust line 412, and may convey a purge mode in which the purge device 410 to which the identified supply valve or exhaust valve is connected may be driven to the display unit 530.

Also, the mode determination unit 500 in an example embodiment may be connected to a data storage unit 510, an input interface 520, a display unit 530, the nRF reader communication module 540, a pressure sensor and a flow sensor 4111 and 4121, and a seating sensor 430.

Specifically, as illustrated in FIG. 4, the mode determination unit 500 in an example embodiment may be connected to the pressure sensor and flow sensor 4111 and 4121 installed in a supply line 411 or an exhaust line 412 of the purge device 410 of the STB 400, and may also be connected to the seating sensor 430 installed below the STB 400. Pressure or changes in flow rate over time when inert gas is supplied or exhausted from the pressure sensor and flow sensor 4111 and 4121 may be measured, and whether the FOUP 5 is seated in the STB 400 may be measured.

Also, the mode determination unit 500 may be connected to a data storage unit 510 for storing the specifications of the purge device 410 corresponding to the signals measured from the pressure sensors and flow sensors 4111 and 4121 and the seating sensor 430. The measured signal may be transmitted to the data storage unit 510, and specifications of the purge device 410 according to the measured pressure or flow rate change value over time may be received from the data storage unit 510.

Also, the mode determination unit 500 drivable according to the received specifications of the purge device 410 may transmit the drivable purge mode to the connected display unit 530, and the purge mode may be activated such that the user can check the drivable purge mode.

In this case, the mode determination unit 500 may be connected to the input interface 520, and when a setting parameter to be determined by a user is required in the drivable purge mode, default values of setting parameters may be provided through the input interface 520, such that new setting parameters may be input by the user.

As an example embodiment, the input interface 520 may be included in the display unit 530 and may share a screen. Alternatively, separate screens may be used for separate devices.

The mode determination unit 500 in another example embodiment may be connected to the nRF reader communication module 540, and may receive supply specifications of the purge device 410 from the nRF reader communication module 540.

Specifically, in each purge device 410, an nRF reader corresponding to each supply specification of the purge device 410 may be determined in advance, and when the STB 400 including the purge device 410 requests nRF reader information from the nRF reader communication module 540, the nRF reader determined in the purge device 410 may be obtained from the nRF reader communication module 540.

For example, when the supply line 411 of the purge device 410 is an inlet having a solenoid valve, an nRF reader of AB and AC controlling a solenoid valve of one inlet may be used. Accordingly, when the purge device 410 requests nRF reader information from the nRF reader communication module 540, the nRF reader communication module 540 may transmit data including information that AB and AC nRF readers are available to the purge device 410.

Accordingly, when the purge device 410 requests a predetermined type of nRF reader to be used for communication, the nRF reader information may be received from the nRF reader communication module 540, and the type of nRF reader may be determined as a type usable for the supply specifications in consideration of the supply specifications of the purge device 410, such that supply specifications of the purge device 410 may be identified from the type of nRF reader.

That is, the mode determination unit 500 may receive the nRF reader information transmitted to the purge device 410 from the nRF reader communication module 540 and may determine supply specifications of the purge device 410.

In other words, the mode determination unit 500 may request the type of nRF reader used by the purge device 410 to the nRF reader communication module 540, and may identify specifications of the supply unit of the purge device 410 corresponding to the type of the nRF reader based on the information received in response to the request.

FIG. 5 is a flowchart illustrating a method for setting an automatic mode of an STB 400 according to an example embodiment.

Referring to FIG. 5 with reference to FIG. 3, the method for automatically setting the purge mode of the STB 400 in an example embodiment, performed by a system for manufacturing a semiconductor wafer including a side track buffer 400 (STB) including a purge device 410 for supplying inert gas to discharge the process gas of the FOUP 5 and a mode determining unit 500 for determining a purge mode in which the purge device 410 of the STB 400 in which the FOUP 5 is seated may be driven, may include identifying specifications of the purge device 410 corresponding to the configuration of the purge device 410 (S510) and determining a purge mode drivable from among predetermined purge modes according to the identified specifications of the purge device 410 (S520).

The identifying the specifications of the purge device 410 (S510) in an example embodiment may include measuring an output generated when a predetermined amount of gas is supplied from a pressure sensor or a flow sensor 4111 connected to the supply line 411 of the purge device 410, and identifying specifications of the supply unit of the purge device 410 according to the measured output.

Alternatively, the determining the specification of the purge device 410 in an example embodiment may include measuring the output generated when gas is exhausted from the pressure sensor or flow sensor 4121 connected to the exhaust line 412 of the purge device 410, and identifying specifications of the exhaust unit of the purge device 410 according to the measured output.

As an example embodiment, the number of supply lines 411 provided in the purge device 410 and presence or absence or type of supply valves connected to the supply line 411 may be identified.

For example, the supply valve may be a solenoid valve for supplying the inert gas in a fixed manner or a variable valve for supplying the inert gas by dynamically controlling the gas according to time.

Also, as an example embodiment, the number of exhaust lines 412 provided in the purge device 410 and presence or absence of a supply valve connected to the exhaust line 412 may be identified.

For example, the exhaust line 412 may be a pipe without an exhaust valve or may be provided with a solenoid valve for regularly discharging an inert gas.

In other words, in an example embodiment, the number of inlets or outlets of the supply line 411 or the exhaust line 412, whether the valve is provided, or the type of valve may be identified by the output obtained from the pressure sensor and the flow sensor 4111 or 4121.

Also, the determining the specification of the purge device 410 in an example embodiment may include identifying the type of the STB 400 including the purge device 410 according to the type of inert gas determined to be supplied by the purge device 410.

As an example embodiment, the STB 400 may be a N2STB receiving nitrogen gas from the gas container 413. When the STB 400 is N2STB, N2 purge mode may be performed, and when the STB 400 is not N2STB, no operation may be performed (NOT USE mode).

Before the identifying the specifications of the purge device 410, determining whether the FOUP 5 is seated on the STB 400 by a seating sensor 430 disposed in the internal lower portion of the housing 210 of the STB 400 may be further included.

Instead of a purge mode in which an actual inert gas is supplied or exhausted, a standby mode in which the FOUP 5 is seated may be further determined, and whether the FOUP 5 is properly seated may be identified using the measurement information of the seating sensor 430.

Meanwhile, as an example embodiment, the output generated when gas is supplied or exhausted from the pressure sensor or flow sensor 4111 or 4121 may be change in measured value over time as measured by at least one pressure sensor or flow sensor 4111, 4121, or may include a difference in measured values measured simultaneously by a plurality of pressure sensors or flow sensors 4111 and 4121.

For example, when an output in which the pressure or flow rate is constantly reduced over time is obtained when the inert gas and the process gas are discharged from the exhaust line 412, it may be determined that the mode is the purge mode in which gas is naturally exhausted, or when the discharged pressure or flow rate over time obtains a constant output when the inert gas and the process gas are discharged, it may be determined that the mode may be a solenoid valve purge mode in which the solenoid valve is turned on/off to perform constant discharge.

As another example embodiment, the pressure sensor or flow sensor 4111 and 4121 may be differential pressure sensors installed on the front and rear ends of the supply line 411 or the exhaust line 412 with respect to the direction in which gas flows.

The determining the specifications of the purge device 410 (S510) in another example embodiment may include requesting the type of nRF reader used by the purge device 410 to the nRF reader communication module 540, and determining the specification of the supply unit of the purge device 410 corresponding to the type of the nRF reader based on the information received in response to the request. The detailed descriptions thereof will be described later with reference to FIG. 6.

As an example embodiment, displaying, when a drivable purge mode is determined, the determined drivable purge mode on a setting screen may be further included.

Also, as an example embodiment, when a setting parameter is required for a selected purge mode among the determined drivable purge modes, an input interface for inputting or changing the setting parameter may be displayed on the setting screen.

FIG. 6 is a flowchart illustrating a method for setting an automatic mode of an STB 400 according to another example embodiment.

As illustrated in FIG. 6, the method for automatically setting the purge mode of the STB 400 in another example embodiment, performed by a system for manufacturing a semiconductor wafer including a STB 400 including a purge device 410 for supplying inert gas to discharge the process gas of the FOUP 5 and a mode determining unit 500 for determining a purge mode in which the purge device 410 of the STB 400 in which the FOUP 5 is seated may be driven, may include requesting the type of nRF reader used by the purge device 410 to the nRF reader communication module 540 and identifying the specifications of the supply unit of the purge device 410 corresponding to the type of the nRF reader based on the information received in response to the request (S611), measuring an output generated when a predetermined gas is exhausted from a pressure sensor or a flow sensor 4121 connected to the exhaust line 412 of the purge device 410 and identifying specifications of the exhaust unit of the purge device 410 according to the measured output (S612), and determining a drivable purge mode among predetermined purge modes according to the identified specifications of the supply unit and the exhaust unit of the purge device 410 (S620).

In other words, the identifying the specifications of the purge device 410 in another example embodiment may include requesting the type of nRF reader used by the purge device 410 to the nRF reader communication module 540 and identifying the specifications of the supply unit of the purge device 410 corresponding to the type of the nRF reader based on information received in response to the request.

As described above, instead of installing the pressure sensor or the flow sensor 4111 in the supply line 411, by receiving an available type of nRF reader from the nRF reader communication module 540 to request a predetermined type of nRF reader from the purge device 410, the specifications of the supply line 411 of the purge device 410 corresponding to the received type of nRF reader may be obtained, and the specification of the supply line 411 may be identified from the received type of type of nRF reader.

As an example embodiment, the specification of the supply line 411 may be identified by receiving the supply specification corresponding to the type of nRF reader obtained from the nRF reader communication module 540 from the data storage unit 510.

As an example embodiment, displaying, when a drivable purge mode is determined, the determined drivable purge mode on a setting screen may be further included.

Specifically, the drivable purge mode may be activated on the setting screen to display the determined drivable purge mode on the setting screen.

Also, as an example embodiment, when a setting parameter is required for a selected purge mode among the determined drivable purge modes, an input interface for inputting or changing the setting parameter may be displayed on the setting screen.

Specifically, providing an input interface for receiving a default value of the setting parameter and a change value for changing the default value may be further included when a drivable setting screen is activated and displayed on the display unit 530, and a setting parameter is required in the activated purge mode.

As an example embodiment, for example, in the identifying the specifications of the supply unit of the purge device 410, when it is determined that the supply line includes a variable valve for adjusting the flow rate of gas from a high flow rate to a low flow rate, the input interface may provide a high flow rate value and a low flow rate value corresponding to the degree of opening and closing of the variable valve, and a timeout (TD) parameter which may be a time during which the valve is adjusted from the high flow rate to the low flow rate.

Since the variable valve adjusts the amount of inert gas supplied from high flow rate to low flow rate, it is necessary to set an adjusted amount or time. Accordingly, when it is identified that a variable valve is provided in the supply line 411 of the purge device 410, a setting parameter may be received.

Meanwhile, as another example embodiment, receiving a user selection for the drivable purge mode and automatically driving the purge device according to the selected purge mode may be further included.

In addition to displaying the drivable purge mode on the display unit 530, it may be controlled to perform the turning on/off of the valve and the turning on/off of the measurement of the sensor according to the selected purge mode.

Accordingly, a drivable purge mode may be determined according to the identified shape of the purge device 410. Hereinafter, assuming that the supply valve 414 is provided in the supply line 411 and the purge device 410 does not have a separate exhaust valve 415 in the exhaust line 412, a process of identifying the specifications of the purge device 410 between the STB 400, the mode determining unit 500, and the data storage unit 510 and determining a driving mode will be described with reference to FIGS. 7 and 8. This is an example embodiment, and when the exhaust valve 415 is present, processes such as opening and closing the exhaust valve may be further performed.

Figure 7:
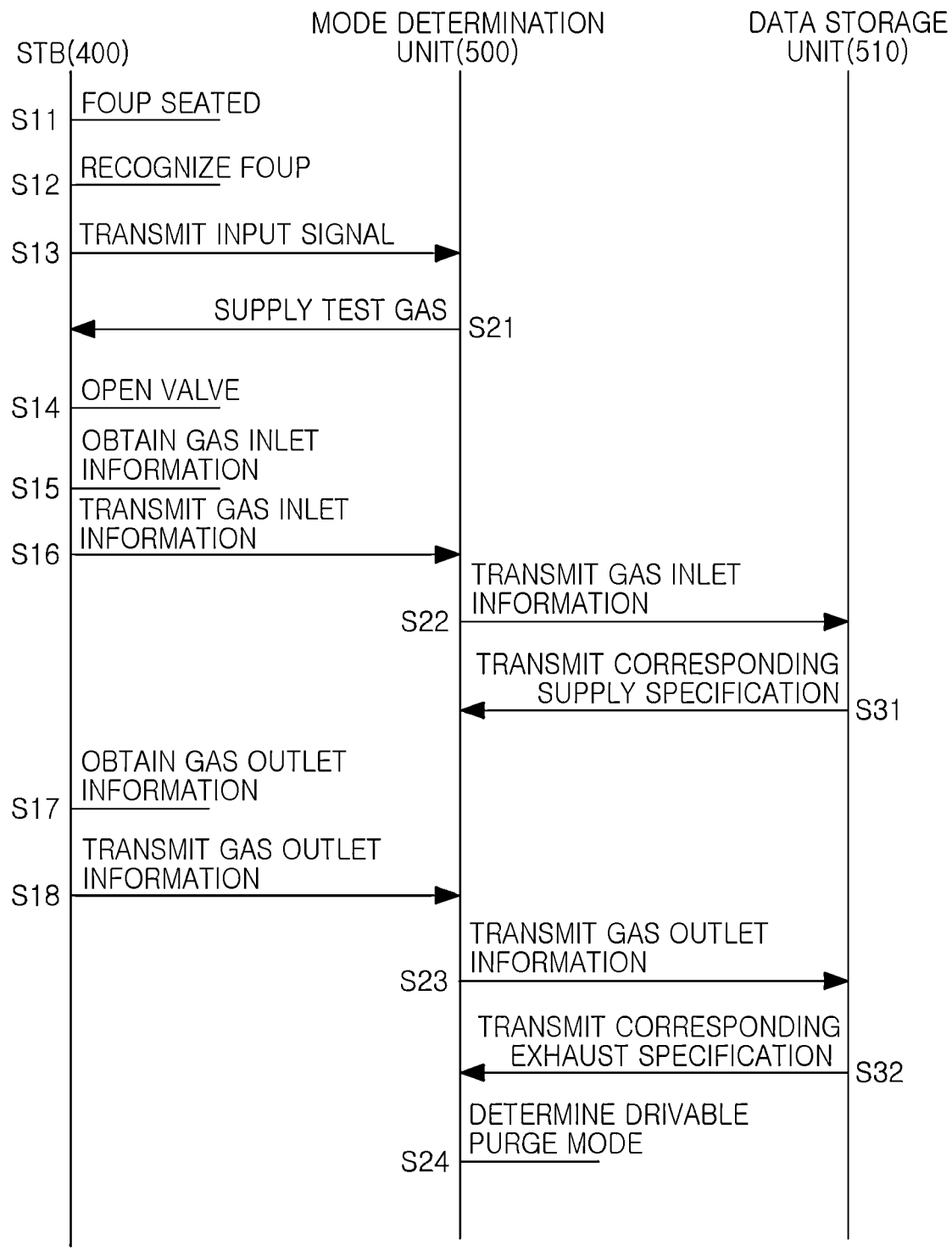
FIG. 7 is a flowchart illustrating a method for setting an automatic mode of an STB according to an example embodiment of the present disclosure.

FIG. 7 is a flowchart illustrating a method for setting an automatic mode of an STB according to an example embodiment.

Specifically, as illustrated in FIG. 7, when the FOUP is seated in the STB 400, the FOUP 5 may be recognized and FOUP ID information may be obtained (S11 and S12). Thereafter, the seating sensor 430 may transmit an input signal according to the seating of the FOUP 5 to the mode determination unit 500 (S13). In this case, the mode determination unit 500 may perform a seating check mode for checking whether the FOUP 5 is seated.

Thereafter, the mode determination unit 500 may command to supply the test gas (S21), and accordingly, the STB 400 may open the supply valve 415 using the purge device 410 (S14), may obtain gas input information using the pressure sensor or the flow sensor 4111, and may transmit the gas input information to the mode determination unit 500 (S15 and S16).

The mode determination unit 500 may transmit the transmitted gas input information to the data storage unit 510 (S22), and the data storage unit 510 may extract corresponding supply specifications from a table storing the specifications of the purge device 410 corresponding to the gas input information and may transmit the supply specifications corresponding to the mode determination unit 500 (S31).

Also, the STB 400 may obtain gas withdrawal information and may transmit the gas withdrawal information to the mode determination unit 500 (S17 and 218), and the mode determination unit 500 may transmit the gas withdrawal information to the data storage unit 500), and receive corresponding exhaust specifications from the data storage unit 500 (S23 and S32).

Alternatively, after obtaining both the gas intake information and the gas withdrawal information, the supply specifications and the exhaust specifications may be received at once.

The mode determination unit 500 may determine a purge mode which may be driven with the obtained supply and exhaust specifications (S24).

The drivable purge modes may include 1) an inlet in which the solenoid supply valve turns on and off to supply inert gas when the FOUP 5 is seated and naturally exhaustion is performed, 2) an inlet/outlet mode in which the solenoid supply valve turns on and off to supply inert gas when the FOUP 5 is seated, forcible exhaustion is performed by operation of the turning on/off the solenoid exhaust valve, 3) a variable flow/outlet mode in which the supply variable valve operates in accordance with the target flow rate (high flow rate supply, low flow rate supply after TD time), and inert gas is supplied when the FOUP 5 is seated, and forcible exhaustion is performed by operation of the turning on/off the solenoid exhaust valve, and 4) a variable flow in which the variable valve for supply supplies inert gas by controlling operation according to the target flow rate (supplying high flow rate and supplying low flow rate after TD time) when the FOUP 5 is seated, and naturally exhaustion is performed.

In this case, the inert gas may be nitrogen gas.

Also, when the STB 400 is not N2STB, a "Not use" mode in which no operation is performed after the FOUP 5 is seated may be driven.

Accordingly, depending on the type of the supply line 411 and the exhaust line 412 and the equipment provided, the drivable purge mode may be activated and provided to the user.

Figure 8:
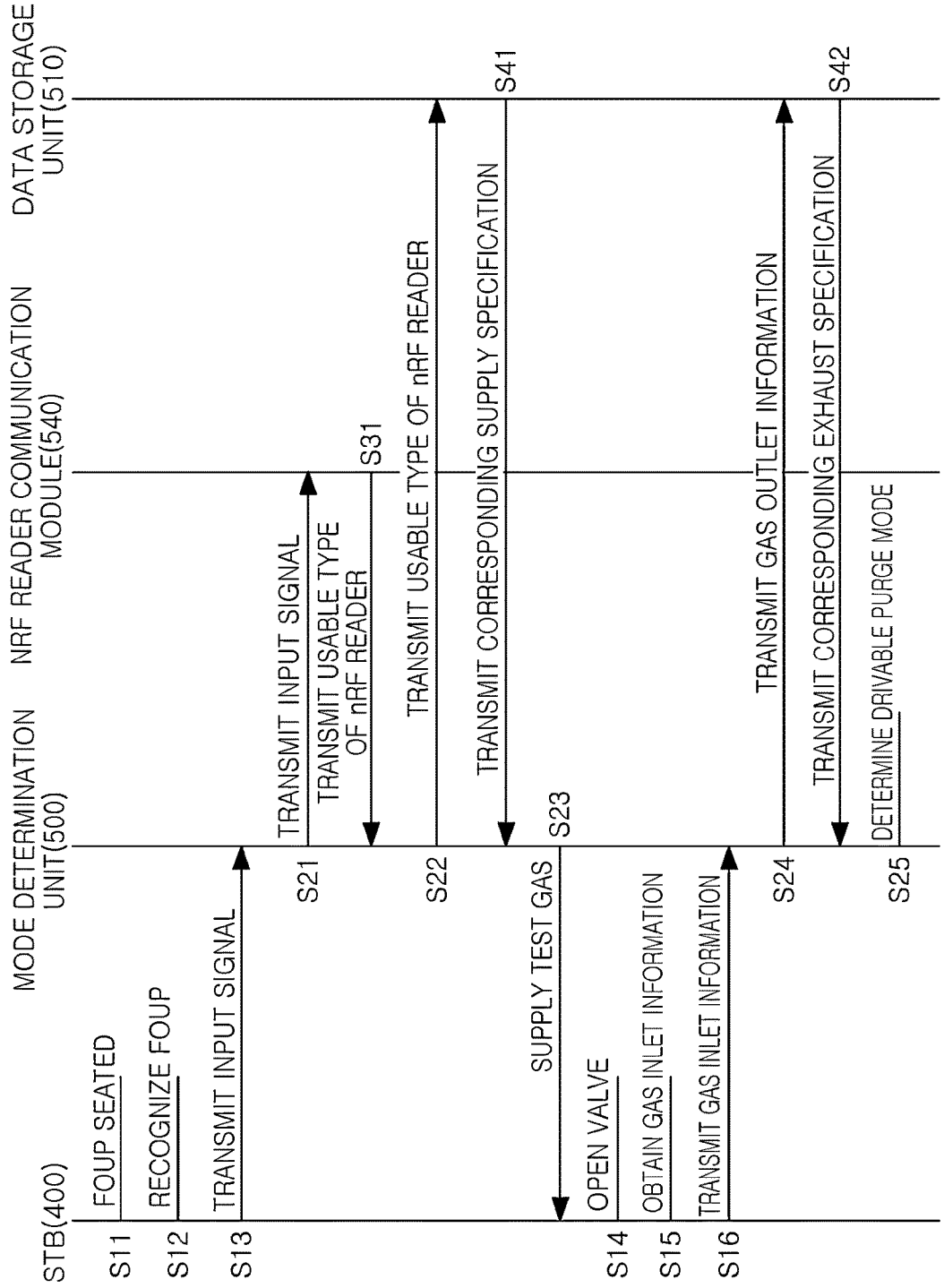
FIG. 8 is a flowchart illustrating a method for setting an automatic mode of an STB according to another example embodiment of the present disclosure.

FIG. 8 is a flowchart illustrating a method for setting an automatic mode of an STB 400 according to another example embodiment.

Specifically, the flowchart in FIG. 8 is almost the same as FIG. 7, but the mode determination unit 500 may receive an input signal from the STB 400 (S13) and may transmit the signal to the nRF reader communication module 540, rather than transmitting the signal to the data storage unit 510 (S21).

The nRF reader communication module 540 may transmit the type of nRF reader usable in the FOUP 5 seated as the information included in the input signal, and the mode determining unit 500 may determine supply specifications through the available type of nRF reader (S31).

For example, when a solenoid valve is connected to the supply line 411, the nRF reader may use AB and AC, and when a variable valve is connected to the supply line 412, the nRF reader may use AD and AE. In the case in which there is no separate valve, the entirety of AB, AC, AD and AE may be used.

That is, since the specification information of the supply line 411 is already included in the nRF reader, the mode determination unit 500 may identify the supply specification with the data received from the nRF reader communication module 540.

In other words, when the purge device 410 includes one inlet as a parameter used for communication, the nRF reader may use parameters suitable for one inlet, and when 3 inlets are included, the nRF reader may use the appropriate parameters for the three inlets, such that, since the nRF reader is information including the supply specifications of the purge device 410, the supply specifications may be identified as illustrated in FIG. 8.

In an example embodiment, as illustrated in FIG. 8, the mode determination unit 500 may transmit the usable type of nRF reader received from the nRF reader communication module 540 to the data storage unit 510, and may transmit supply specifications corresponding to the usable type of nRF reader (S22 and S41).

That is, the mode determination unit 500 may identify the corresponding supply specification according to the type of nRF reader, or as illustrated in FIG. 8, the mode determination unit 500 may identify the specification by receiving supply specifications from the data storage unit 510 in which a corresponding supply specification table is stored according to the type of nRF reader.

Using the above-described method, human error of an operator performing an inoperable purge mode may be eliminated and convenience in maintenance may improve.

Also, the example embodiment may provide a computer recording medium storing a computer program for performing the above-described method for automatically setting the purge mode of the STB on a computer.

The above-described method for automatically setting the purge mode of the STB in an example embodiment may be produced as a program to be executed on a computer and may be stored in a computer-readable recording medium. Examples of computer-readable recording media may include ROM, RAM, CD-ROM, magnetic tape, floppy disk, optical data storage device, and the like. Also, the computer-readable recording medium may be distributed to computer systems connected through a network, and computer-readable codes may be stored and executed in a distributed manner. Also, functional programs, codes, and code segments for implementing the method may be easily inferred by programmers in the art to which the example embodiment belongs.

Also, in the description of the example embodiment, " . . . unit" may be implemented in various manners, for example, a processor, program instructions executed by the processor, software module, microcode, computer program product, logic circuit, application-specific integration circuitry, firmware, and the like.

The descriptions of the method disclosed in the example embodiments may be directly implemented by a hardware processor, or may be implemented and completed by a combination of hardware and software modules among processors. The software modules may be stored in conventional storage media such as random access memory, flash memory, read only memory, programmable read only memory or electrically erasable programmable memory, registers, or the like. The storage medium may be disposed in a memory, and the processor may read the information stored in the memory and may combine with the hardware to complete the above method. Overlapping descriptions will not be provided herein.

According to the aforementioned example embodiments, only the purge mode which may be operated by the operator may be activated and displayed, damage or failure of the device by driving the purge mode, which may not be operated by the operator may be prevented, and human errors caused by the operator may be eliminated.

Also, a drivable mode may be immediately identified and selected, thereby improving convenience in maintenance of the semiconductor system.

While the example embodiments have been illustrated and described above, it will be apparent to those skilled in the art that modifications and variations could be made without departing from the scope of the present disclosure as defined by the appended claims.

What is claimed is:

1. A method of automatically setting a purge mode of an STB, performed by a system for manufacturing a semiconductor wafer including a side track buffer (STB) including a purge device for supplying inert gas to discharge a process gas of a FOUP, and a mode determination unit for determining a purge mode in which the purge device of the STB in which the FOUP is seated is able to be driven, the method comprising:
identifying specifications of the purge device corresponding to a configuration of the purge device; and
determining a drivable purge mode from among predetermined purge modes depending on the identified specifications of the purge device.

2. The method of claim 1, wherein the identifying specifications of the purge device includes measuring an output generated when a predetermined amount of gas is supplied from a pressure sensor or a flow sensor connected to a supply line of the purge device, and identifying specifications of a supply unit of the purge device according to the measured output.

3. The method of claim 1, wherein the identifying specifications of the purge device includes measuring an output generated when gas is exhausted from a pressure sensor or a flow sensor connected to an exhaust line of the purge device, and identifying specifications of an exhaust unit of the purge device according to the measured output.

4. The method of claim 1, wherein the identifying specifications of the purge device includes identifying a type of the STB including the purge device depending on a type of inert gas determined to be supplied by the purge device.

5. The method of claim 1, wherein the method further includes determining whether the FOUP is seated on the STB by a seating sensor disposed in an internal lower portion of the housing of the STB before the determining specifications of the purge device.

6. The method of claim 2, wherein the output is a change in measured values over time, measured by at least one pressure sensor or flow sensor, or includes a difference in measured values measured simultaneously by a plurality of pressure sensors or flow sensors.

7. The method of claim 6, wherein the pressure sensor is a differential pressure sensor installed on front and rear ends with respect to a direction in which gas flows in the supply line or the exhaust line.

8. The method of claim 2, wherein the identifying specifications of a supply unit of the purge device includes determining the number of supply lines provided in the purge device and presence or a type of a supply valve connected to the supply lines.

9. The method of claim 3, wherein the identifying specifications of an exhaust unit of the purge device includes determining the number of exhaust lines provided in the purge device and presence or absence of an exhaust valve connected to the exhaust line.

10. The method of claim 8, wherein the supply valve is a solenoid valve for regularly supplying an inert gas or a variable valve for supplying an inert gas by dynamically controlling the inert gas depending on time.

11. The method of claim 9, wherein the exhaust line is a pipe without an exhaust valve or including a solenoid valve for regularly discharging inert gas.

12. The method of claim 1, wherein the identifying specifications of the purge device includes requesting a type of nRF reader used by the purge device to an nRF reader communication module, and identifying specifications of a supply unit of the purge device corresponding to the type of the nRF reader based on information received in response to the request.

13. The method of claim 12, further comprising:
displaying the determined drivable purge mode on a setting screen,
wherein when a setting parameter is required for the selected purge mode among the determined drivable purge modes, an input interface to input or change the setting parameter is displayed on the setting screen.

14. A method of automatically setting a purge mode of an STB, performed by a system for manufacturing a semiconductor wafer including a side track buffer (STB) including a purge device for supplying inert gas to discharge a process gas of a FOUP, and a mode determination unit for determining a purge mode in which the purge device of the STB in which the FOUP is seated is able to be driven, the method comprising:
requesting a type of nRF reader used by the purge device to an nRF reader communication module, and identifying specifications of a supply unit of the purge device corresponding to the type of the nRF reader based on information received in response to the request;
measuring an output generated when a predetermined gas is exhausted from a pressure sensor or a flow sensor connected to an exhaust line of the purge device, and determining specifications of an exhaust unit of the purge device according to the measured output; and
determining a drivable purge mode among predetermined purge modes according to the identified specification of a supply unit and the identified specification of an exhaust unit of the purge device.

15. The method of claim 14, further comprising:
activating the drivable purge mode on a setting screen; and
providing an input interface for receiving a default value of a setting parameter and a change value for changing the default value when the setting parameter is required in the activated purge mode.

16. The method of claim 15, wherein, when it is identified that the supply line includes a variable valve for adjusting a flow rate of gas from a high flow rate to a low flow rate in the identifying specifications of a supply unit of the purge device, providing a high flow value and a low flow value corresponding to the degree of opening and closing of the variable valve and a timeout (TD) parameter which is a time during which the valve is adjusted from the high flow rate to the low flow rate in the input interface.

17. The method of claim 14, further comprising:
receiving a user selection for the drivable purge mode and automatically driving the purge device according to the selected purge mode.

18. A system for manufacturing a semiconductor wafer, the system comprising:
a side track buffer (STB) including a purge device including a pressure sensor for measuring pressure of inert gas supplied to or exhausted from the FOUP over time, a port in which the FOUP is mounted, and a seating sensor connected to the port to measure whether the FOUP is seated, and supplying the supplied inert gas to the FOUP; and a mode determination unit for identifying specifications of the purge device of the STB in which the FOUP is seated according to an output value obtained by the pressure sensor, and determining a purge mode in which the purge device is able to be driven.

19. The system of claim 18, further comprising:

a display unit providing the determined purge mode to a user, wherein the pressure sensor is connected to a supply line for entering the inert gas to the FOUP or an exhaust line for withdrawing the inert gas, wherein the mode determination unit identifies a supply valve or an exhaust valve of the purge device according to an output of the pressure sensor measured by the supply line or the exhaust line, and wherein a purge mode in which the purge device connected to the identified supply valve or exhaust valve is able to be driven is transferred to the display unit.

* * * * *